(12) United States Patent
Sewell

(10) Patent No.: US 7,399,422 B2
(45) Date of Patent: Jul. 15, 2008

(54) SYSTEM AND METHOD FOR FORMING NANODISKS USED IN IMPRINT LITHOGRAPHY AND NANODISK AND MEMORY DISK FORMED THEREBY

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 111 days.

(21) Appl. No.: 11/288,135

(22) Filed: Nov. 29, 2005

(65) Prior Publication Data
US 2007/0121375 A1   May 31, 2007

(51) Int. Cl.
*B44C 1/22* (2006.01)
*C03C 25/68* (2006.01)
*C23F 1/00* (2006.01)

(52) U.S. Cl. .............................. 216/54; 216/2; 216/52; 977/887

(58) Field of Classification Search .................. 216/22, 216/24, 44, 99, 52, 54; 430/310, 323; 977/887; 428/64.4; 264/1.33
See application file for complete search history.

(56) References Cited

U.S. PATENT DOCUMENTS

| 5,669,303 | A | 9/1997 | Maracas et al. |
| 5,772,905 | A | 6/1998 | Chou |
| 6,238,271 | B1 | 5/2001 | Cesna |
| 6,264,848 | B1 | 7/2001 | Belser et al. |
| 6,365,059 | B1 | 4/2002 | Pechenik |
| 6,399,173 | B1 | 6/2002 | Nagayama et al. |
| 6,482,742 | B1 | 11/2002 | Chou |
| 6,507,456 | B1 | 1/2003 | Dinan et al. |
| 6,518,189 | B1 | 2/2003 | Chou |
| 6,531,202 | B1 | 3/2003 | Litvinov et al. |
| 6,601,629 | B2 | 8/2003 | Toyoda et al. |
| 6,656,021 | B2 | 12/2003 | Ota et al. |
| 6,740,209 | B2 | 5/2004 | Shibamoto et al. |
| 6,743,368 | B2 * | 6/2004 | Lee ............................. 216/2 |
| 6,757,116 | B1 | 6/2004 | Curtiss et al. |

(Continued)

FOREIGN PATENT DOCUMENTS

| EP | 0 617 457 A2 | 9/1994 |
| EP | 1 072 954 A2 | 1/2001 |
| JP | 5-314474 A | 11/1993 |
| WO | WO 01/59523 A1 | 8/2001 |
| WO | WO 02/42844 A2 | 5/2002 |

(Continued)

OTHER PUBLICATIONS

Moritz, J. et al., "Patterned Media Made From Pre-etched Wafers: A Promising Route Toward Ultrahigh-Density Magnetic Recording," *IEEE Transactions on Magnetics*, vol. 38, No. 4, pp. 1731-1736 (Jul. 2002).

(Continued)

*Primary Examiner*—Roberts Culbert
(74) *Attorney, Agent, or Firm*—Sterne, Kessler, Goldstein & Fox P.L.L.C.

(57) ABSTRACT

A system and method form a nanodisk that can be used to form isolated data bits on a memory disk. The imprint stamp is formed from first and second overlapping patterns, where the patterns are selectively etched. The selective etching leaves either pits or posts on the imprint stamp. The pits or posts are imprinted on the memory disk, leaving either pits or posts on the memory disk. The pits or posts on the memory disk are processed to form relatively small and dense isolated data bits. Instability of the isolated data bits caused by outside magnetic and thermal influences is substantially eliminated.

10 Claims, 20 Drawing Sheets

U.S. PATENT DOCUMENTS

| | | |
|---|---|---|
| 6,809,356 B2 | 10/2004 | Chou |
| 6,814,898 B1 | 11/2004 | Deeman et al. |
| 6,869,557 B1 | 3/2005 | Wago et al. |
| 6,951,173 B1 | 10/2005 | Meissl et al. |
| 6,964,793 B2 | 11/2005 | Willson et al. |
| 2002/0071214 A1 | 6/2002 | Belser |
| 2002/0114978 A1 | 8/2002 | Chang et al. |
| 2003/0017424 A1 | 1/2003 | Park et al. |
| 2003/0091865 A1 | 5/2003 | Chen et al. |
| 2003/0104316 A1 | 6/2003 | Wang et al. |
| 2003/0127007 A1 | 7/2003 | Sakurai et al. |
| 2003/0203319 A1 | 10/2003 | Lee |
| 2004/0090610 A1 | 5/2004 | Hatakeyama et al. |
| 2004/0101713 A1 | 5/2004 | Wachenschwanz et al. |
| 2004/0124566 A1 | 7/2004 | Sreenivasan et al. |
| 2004/0132301 A1 | 7/2004 | Harper et al. |
| 2004/0146792 A1 | 7/2004 | Nimmakayala et al. |
| 2004/0169441 A1 | 9/2004 | Choi et al. |
| 2004/0182820 A1 | 9/2004 | Motowaki et al. |
| 2004/0195202 A1 | 10/2004 | Pechenik |
| 2004/0197712 A1 | 10/2004 | Jacobson et al. |
| 2004/0202865 A1 | 10/2004 | Homola et al. |
| 2004/0209123 A1 | 10/2004 | Bajorek et al. |
| 2004/0211755 A1 | 10/2004 | Yusa et al. |
| 2005/0116370 A1 | 6/2005 | Ogino et al. |
| 2005/0118817 A1 | 6/2005 | Fujita et al. |
| 2005/0130074 A1 | 6/2005 | Krause et al. |
| 2005/0133954 A1 | 6/2005 | Homola |
| 2005/0146078 A1 | 7/2005 | Chou et al. |
| 2005/0150862 A1 | 7/2005 | Harper et al. |
| 2005/0151282 A1 | 7/2005 | Harper et al. |
| 2005/0151300 A1 | 7/2005 | Harper et al. |
| 2005/0155554 A1 | 7/2005 | Saito |
| 2005/0156342 A1 | 7/2005 | Harper et al. |
| 2005/0158163 A1 | 7/2005 | Harper et al. |
| 2005/0167847 A1 | 8/2005 | Olsson |
| 2005/0172848 A1 | 8/2005 | Olsson |
| 2005/0191418 A1 | 9/2005 | Bietsch et al. |
| 2005/0212178 A1 | 9/2005 | Nien et al. |
| 2006/0130317 A1 | 6/2006 | Sewell |
| 2006/0130678 A1 | 6/2006 | Sewell |
| 2006/0131270 A1 | 6/2006 | Sewell |
| 2006/0131785 A1 | 6/2006 | Sewell |

FOREIGN PATENT DOCUMENTS

| | | |
|---|---|---|
| WO | WO 02/42844 A3 | 5/2002 |
| WO | WO 02/091460 A2 | 11/2002 |
| WO | WO 02/091460 A3 | 11/2002 |
| WO | WO 03/099463 A2 | 12/2003 |
| WO | WO 03/099463 A3 | 12/2003 |
| WO | WO 2004/013697 A2 | 2/2004 |
| WO | WO 2004/013697 A3 | 2/2004 |
| WO | WO 2004/021083 A1 | 3/2004 |
| WO | WO 2004/099879 A2 | 11/2004 |

OTHER PUBLICATIONS

Requirement for Restriction/Election for U.S. Appl. No. 11/012,474, mailed on Jul. 6, 2007.
First Non-Final Rejection for U.S. Appl. No. 11/012,489, mailed on Dec. 19, 2006.
Final Rejection for U.S. Appl. No. 11/012,489, mailed on Jun. 15, 2007.
Non-Final Rejection for U.S. Appl. No. 11/012,598, mailed on Feb. 24, 2006.
Second Final Rejection for U.S. Appl. No. 11/012,598, mailed on Sep. 11, 2007.
Second Non-Final Rejection for U.S. Appl. No. 11/012,598, mailed on Mar. 27, 2007.
First Final Rejection for U.S. Appl. No. 11/012,598, mailed Sep. 21, 2006.
Non-Final Rejection for U.S. Appl. No. 11/224,316, mailed Jul. 3, 2007.
International Search Report and Written Opinion for International Application No. PCT/US05/45458 mailed Sep. 4, 2007, 8 pgs.
Non-Final Rejection for U.S. Appl. No. 11/012,489, mailed Oct. 29, 2007.
Non-Final Rejection for U.S. Appl. No. 11/012,474, mailed Jan. 28, 2008.
Notice of Allowability for U.S. Appl. No. 11/012,598, mailed Nov. 28, 2007.
Notice of Allowability for U.S. Appl. No. 11/224,316, mailed Jan. 2, 2008.

* cited by examiner

SYSTEM AND METHOD FOR FORMING NANODISKS USED IN IMPRINT LITHOGRAPHY AND NANODISK AND MEMORY DISK FORMED THEREBY

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution can be achieved by using light of shorter wavelength. However, there are problems associated with such reductions. Current systems are starting to adopt optical sources with wavelengths in the 193 nm regime, but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mold or template. The imprintable medium can be the substrate or a material coated on to a surface of the substrate. The imprintable medium can be functional or can be used as a "mask" to transfer a pattern to an underlying surface. The imprintable medium can, for example, be provided as a resist deposited on a substrate, such as a semiconductor material, to which the pattern defined by the template is to be transferred. Imprint lithography is thus essentially a molding process on a micrometer or nanometer scale in which the topography of a template defines the patterns created on a substrate. Patterns can be layered as with optical lithography processes so that in principle imprint lithography could be used for such applications as IC manufacture.

The resolution of imprint lithography is limited only by the resolution of the template fabrication process, for example, imprint lithography has been used to produce features in the sub-50 nm range with significantly improved resolution and line edge roughness compared to that achievable with conventional optical lithography processes. In addition, imprint processes do not require expensive optics, advanced illumination sources, or specialized resist materials typically required by optical lithography processes.

Current imprint lithography processes can have a number of drawbacks particularly with regard to achieving overlay accuracy and high throughput. However, significant improvements in resolution and line edge roughness attainable are from imprint lithography.

Imprint lithography is being used to form memory disks or memory platens that adhere to an ever increasing requirement for very dense data bit formation. However, forming denser data bits means each bit must be smaller and closer together. This closeness of the data bits can lead to data bits becoming unstable, either through thermal influences or outside magnetic influences (e.g., through superpara magnetism).

Therefore, what is needed is a system and method that can form dense and relatively small isolated data bits that will remain stable even when influenced by extraneous magnetic and thermal influences, for example through forming them as discrete isolated islands of magnetic material.

SUMMARY

An embodiment of the present invention provides a method A method of forming a nanodisk, comprising the following steps. Forming a first annular pattern comprising alternating sections of first and second materials. Imprinting the first annular pattern with a second pattern to form a cross hatched pattern on the first pattern. Selectively etching portions of the first and the second patterns on the nanodisk.

Another embodiment of the present invention provides a method of forming a wedge-shaped pattern comprising the following steps. Producing first and second materials using first and second thin film deposition sources. Alternating passage of the first and second materials through respective first and second shutters. Transmitting the fist and second materials using respective first and second openings of a deposition baffle. Rotating a substrate on an opposite side of the deposition baffle as the first and second deposition sources, the rotating substrate receiving the first and second materials to form successive layers of a boule. Removing sections of the boule to form the wedge-shaped pattern.

A further embodiment of the present invention provides a nanodisk for use in imprint lithography comprising tracks on a substrate and selectively etched areas proximate the tracks. The selectively etched areas form data bit areas when the nanodisk is imprinted onto a memory platen.

A still further embodiment of the present invention provides a memory platen comprising main tracks, isolated data bits, and servo tracks. The main tracks are formed by main tracks of an nanodisk. The isolated data bits are formed by data bit areas on the nanodisk, the data bit areas of the nanodisk being located proximate the main tracks of the nanodisk. The servo tracks are formed by servo tracks of the nanodisk, the servo tracks of the nanodisk being locating proximate one or more of the main tracks of the nanodisk.

A yet further embodiment of the present invention provides a method of manufacturing a memory disk. Main tracks are formed on a disk platen. Isolated bit areas are formed with respect to the main tracks on the disk platen. A magnetic layer is formed on the isolated bit areas with magnetic material to form discrete isolated data bits.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1, 2, and 3 illustrate examples of conventional soft, hot and UV lithography processes, respectively.

FIG. 4 illustrates a two-step etching process employed when hot and UV imprint lithography is used to pattern a resist layer.

FIG. 5 schematically illustrates a template and a typical imprintable resist layer deposited on a substrate.

DETAILED DESCRIPTION

Figure 1:
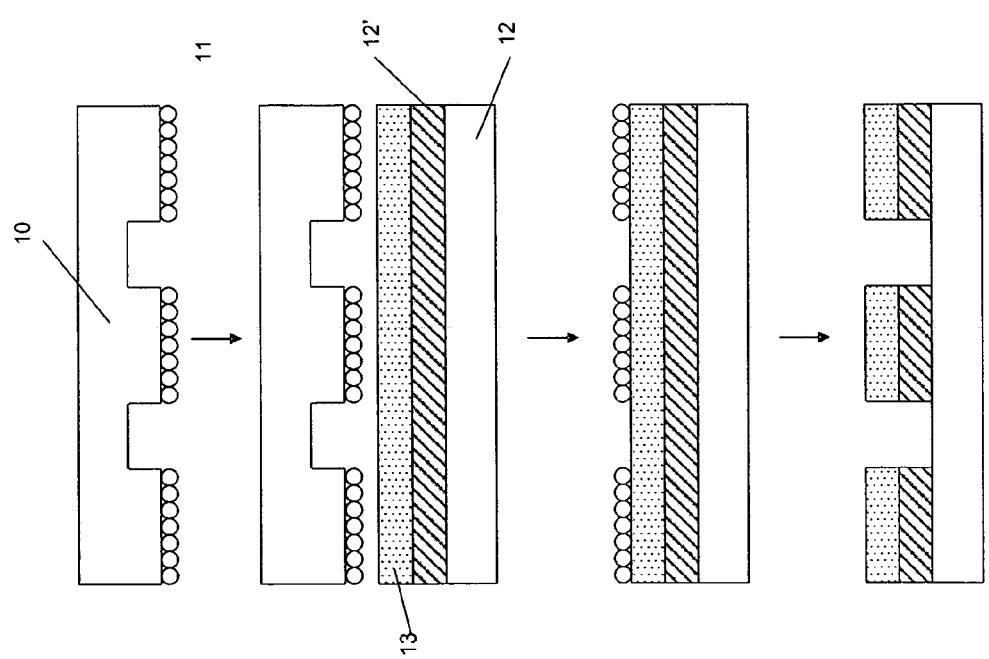

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware and/or the entities illustrated in the drawings. Thus, the operation and behavior of the present invention will be described with the understanding that modifications and variations of the embodiments are possible, given the level of detail presented herein.

One or more embodiments of the present invention provide a system and method to form a memory disk having isolated data bits, for example using imprint lithography. In the example using imprint lithography, the imprint stamp is formed from first and second overlapping patterns, where the patterns are selectively etched. The selective etching leaves either pits or posts on the imprint stamp. The pits or posts are imprinted on the memory disk, leaving either pits or posts on the memory disk. The pits or posts on the memory disk are processed to form relatively small and dense isolated data bits. Instability of the isolated data bits caused by outside magnetic and thermal influences is substantially eliminated.

Figure 2:
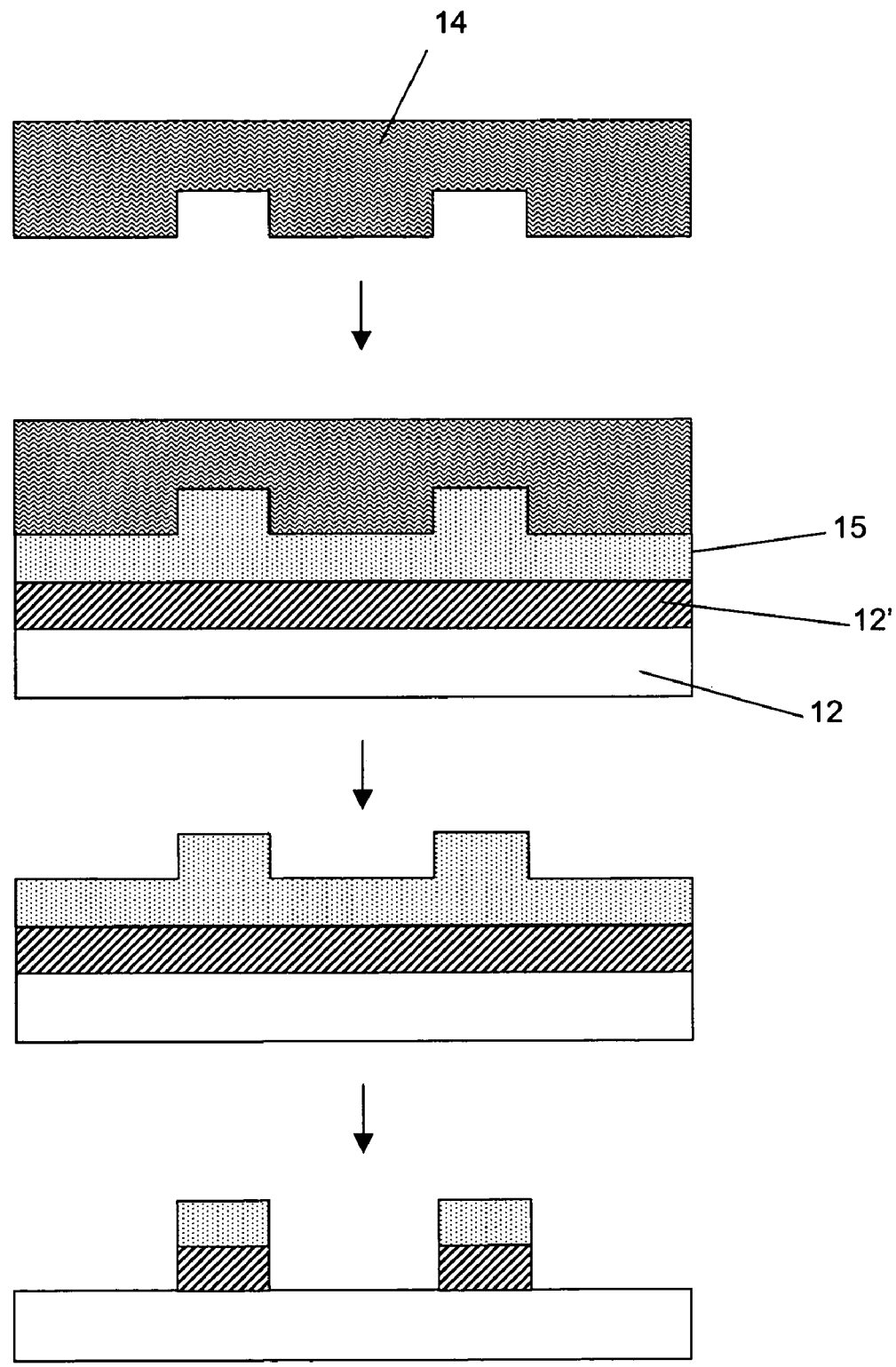
Figure 3:
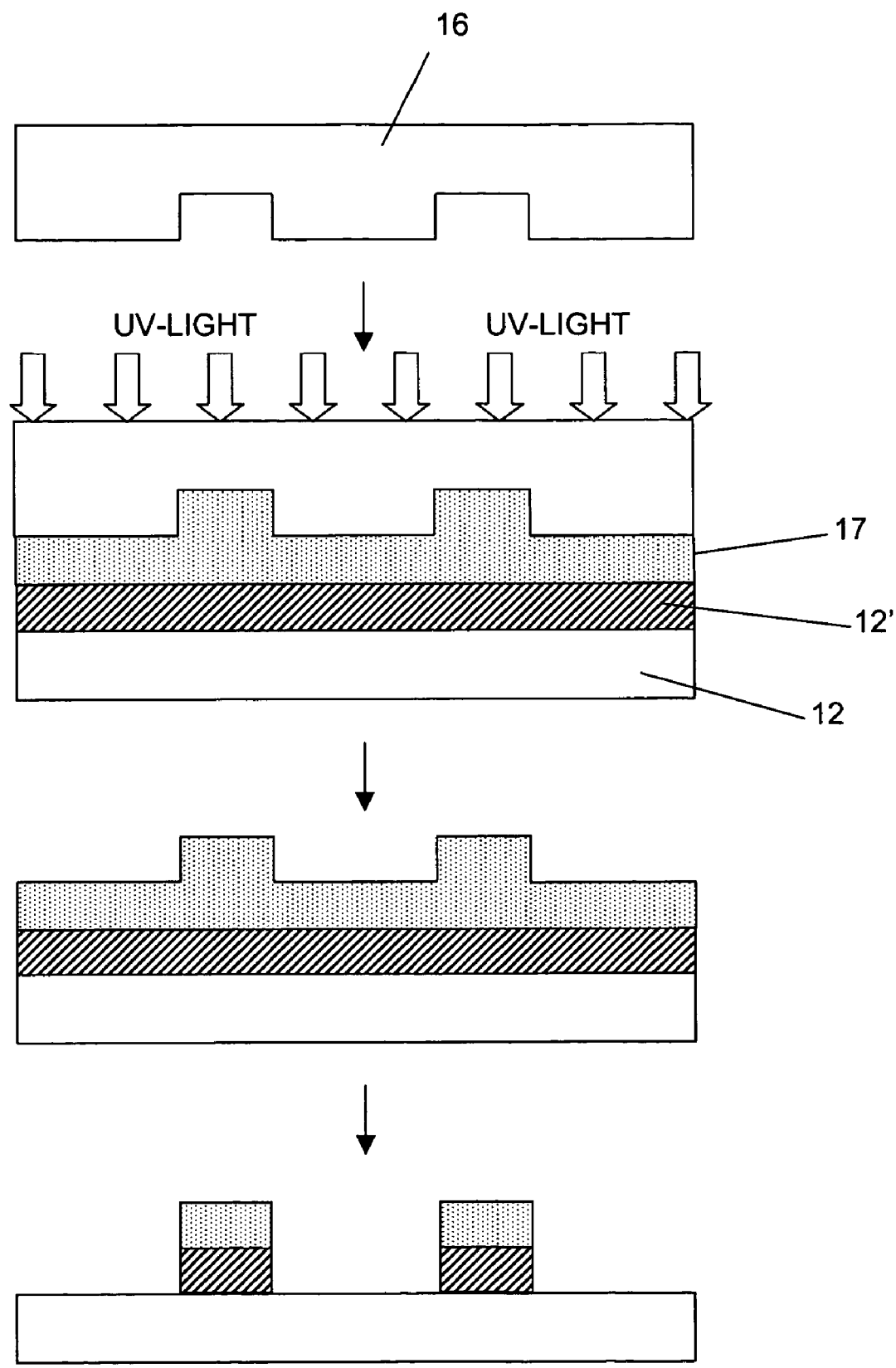

There are two principal approaches to imprint lithography, which will be termed generally as hot imprint lithography and UV imprint lithography. There is also a third type of "printing" lithography known as soft lithography. Examples of these are illustrated in FIGS. 1 to 3.

FIG. 1 shows the soft lithography process that involves transferring a layer of molecules 11 (typically an ink such as a thiol) from a flexible template 10 (typically fabricated from polydimethylsiloxane (PDMS)) onto a resist layer 13 that is supported upon a substrate 12 and planarization and transfer layer 12'. The template 10 has a pattern of features on its surface, the molecular layer being disposed upon the features. When the template is pressed against the resist layer the layer of molecules 11 stick to the resist. Upon removal of the template from the resist the layer of molecules 11 stick to the resist and the residual layer of resist is etched, such that the areas of the resist not covered by the transferred molecular layer are etched down to the substrate.

The template used in soft lithography can be easily deformed and can therefore not be suited to high-resolution applications, e.g., on a nanometer scale, since the deformation of the template can adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses harder templates made from, for example, silicon or nickel, which are more resistant to wear and deformation. This is described, for example, in U.S. Pat. No. 6,482,742 and illustrated in FIG. 2 of the instant application.

In a typical hot imprint process a solid template 14 is imprinted into a thermosetting or a thermoplastic polymer resin 15, which has been cast on the surface of a substrate 12. The resin can, for example, be spin coated and baked onto the substrate surface or more typically (as in the example illustrated) onto a planarization and transfer layer 12'. It shall be understood that the term "hard" when describing an imprint template includes materials that can generally be considered between "hard" and "soft" materials, such as for example "hard" rubber. The suitability of a particular material for use as an imprint template is determined by its application requirements.

When a thermosetting polymer resin is used the resin is heated to a temperature such that, upon contact with the template, the resin is sufficiently flowable to flow into the pattern features defined on the template. The temperature of the resin is then increased to thermally cure (e.g., crosslink) the resin so that it solidifies and irreversibly adopts the desired pattern. The template can then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resins to temperatures considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin that can then be removed by an appropriate etch process to leave only the pattern features.

Figure 4:
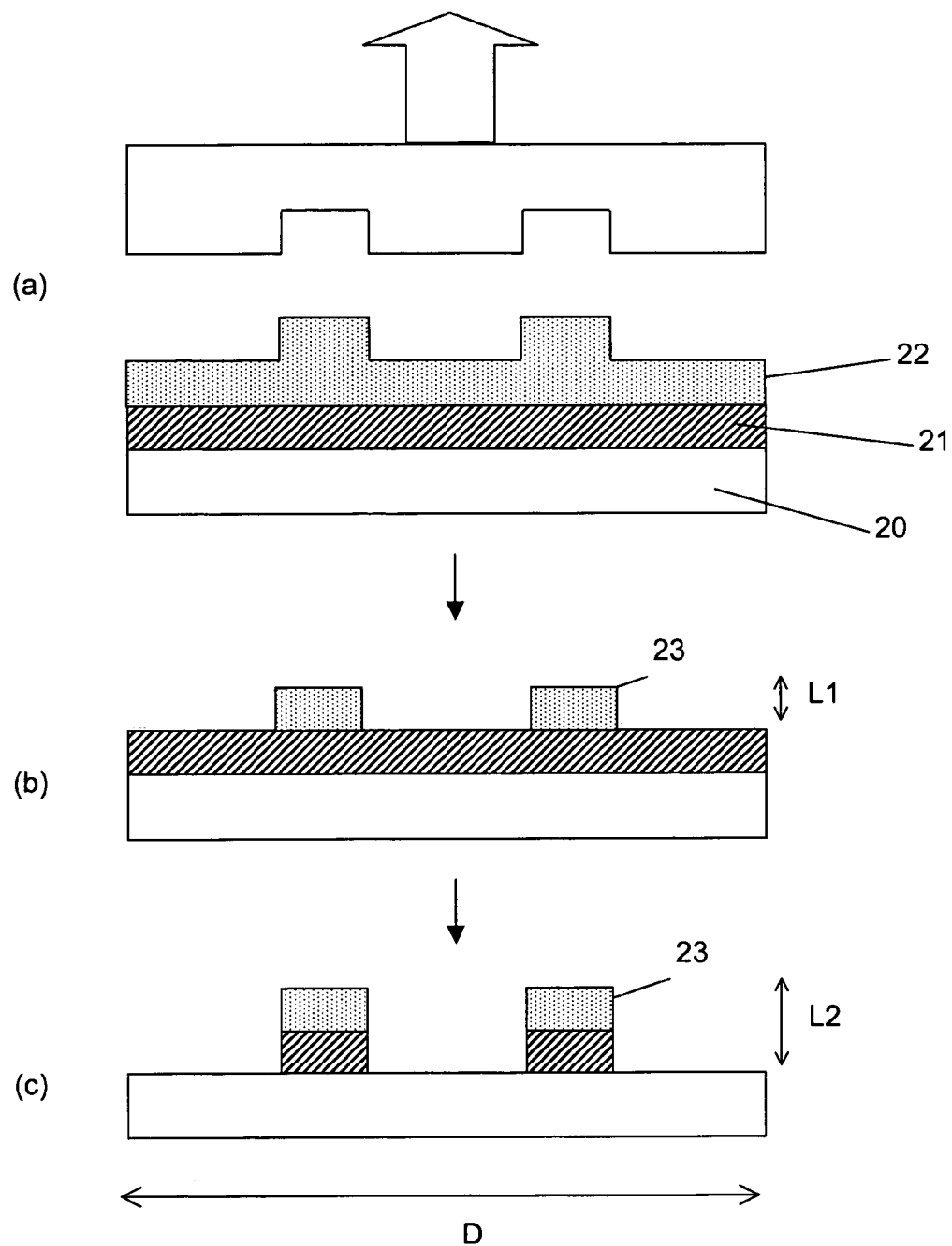

Upon removal of the template from the solidified resin, a two-step etching process is performed as illustrated in FIG. 4. The substrate 20 has a planarization and transfer layer 21 upon it, as shown in step a. The purpose of the planarization and transfer layer is twofold. It acts to provide a surface parallel to that of the template, which is important to ensure that the contact between the template and the resin is parallel, and also to improve the aspect ratio of the printed features, as will be described below.

After the template has been removed, a residual layer 22 of the solidified resin is left on the planarization and transfer layer, shaped in the desired pattern. The first etch is anisotropic and removes parts of the residual layer, resulting in a high aspect ratio of features where L1 is the height of the features 23, as shown in step b. The second etch is anisotropic (or selective) and further improves the aspect ratio. The anisotropic etch removes those parts of the planarization and transfer layer which are not covered by the solidified resin, increasing the aspect ratio of the features 23 to (L2/D), as shown in step c. The resulting polymer thickness contrast left on the substrate after etching can be used as, for example, a mask for dry etching if the imprinted polymer is sufficiently resistant, for example, as a step in a lift-off process.

Hot imprint lithography suffers from a disadvantage in that not only is the pattern transfer be performed at a higher temperature, but also relatively large temperature differentials might be required in order to ensure the resin is adequately solidified before the template is removed. Temperature differentials between about 35 and about 100° C. are known from literature. Differential thermal expansion between, for example, the substrate and template, can then lead to distortion in the transferred pattern. The problem is exacerbated by the relatively high pressures used for the imprinting step, due the viscous nature of the imprintable materials, which can induce mechanical deformation in the substrate, again distorting the pattern. It is to be appreciated that the imprint temperature and pressure are critical to successful imprinting.

UV imprint lithography on the other hand does not involve such high temperatures and temperature changes. Nor does it require such viscous imprintable materials. Rather UV imprint lithography involves the use of a transparent template and a UV-curable liquid, typically a monomer such as an acrylate or methacrylate for example. In general any photo-polymerisable material could be used, such as a mixture of monomers and an initiator. The curable liquid can also, for example, include a dimethyl siloxane derivative. Such materials are much less viscous than the thermosetting and thermoplastic resins used in hot imprint lithography and consequently move much faster to fill template pattern features. Low temperature and low pressure operation also favors higher throughput capabilities.

Figure 5:
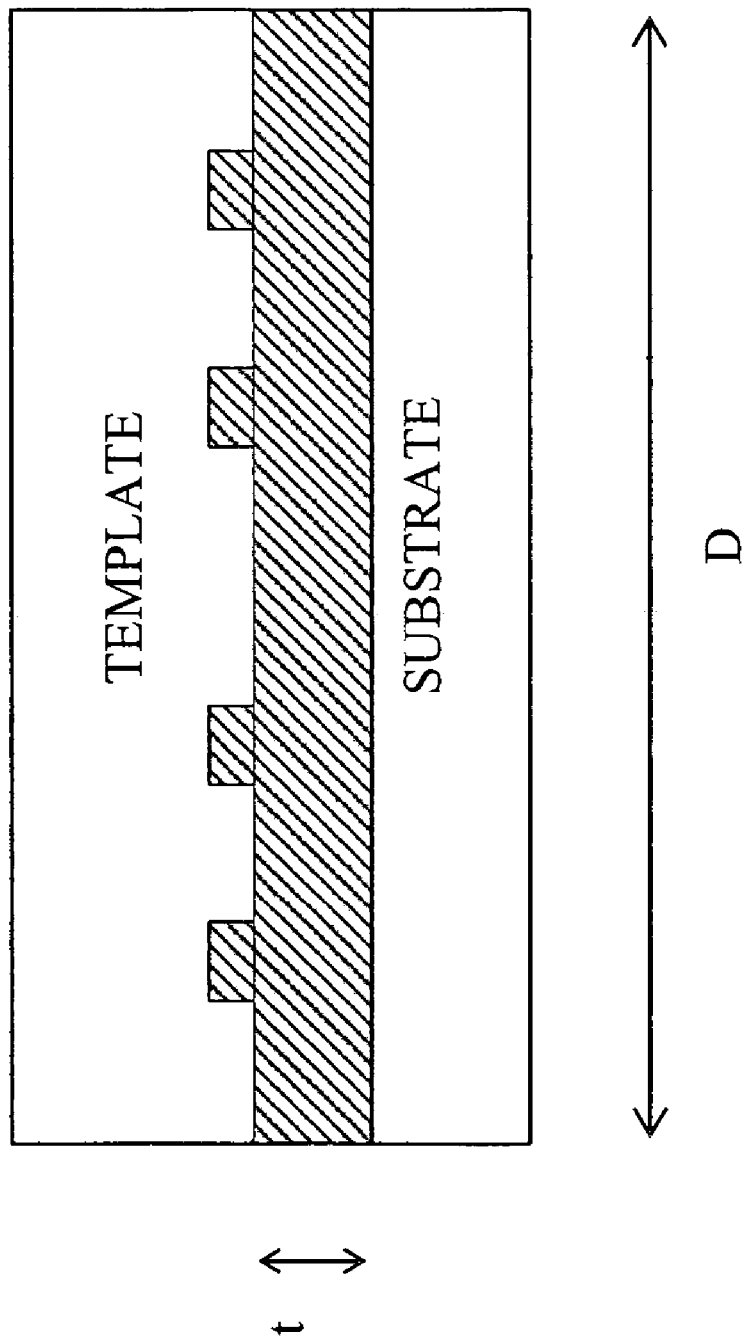

An example of a UV imprint process is illustrated in FIG. 5. A quartz template 16 is applied to a UV-curable resin 17 in a similar manner to the process of FIG. 4. Instead of raising the temperature as in hot embossing employing thermosetting resins, or temperature cycling when using thermoplastic resins, UV light is applied to the resin through the quartz template in order to polymerize and thus cure it. Upon removal of the template, the remaining steps of etching the residual layer of resist are the same as for the hot embossing process described above. The UV curable resins typically used have a much lower viscosity than typical thermoplastic resins so that lower imprint pressures are used. Reduced physical deformation due to the lower pressures, together with reduced deformation due to high temperatures and temperature changes, makes UV imprint lithography better suited to application requiring high overlay accuracy. In addition, the transparent nature of UV imprint templates can accommodate optical alignment techniques simultaneously to the imprint.

Although this type of imprint lithography mainly uses UV curable materials, and is thus generically referred to as UV imprint lithography, other wavelengths of light can be used to cure appropriately selected materials (e.g., activate a polymerization or cross-linking reaction). In general any radiation capable of initiating such a chemical reaction can be used if an appropriate imprintable material is available. Alternative "activating light" can, for example, include visible light, infrared light, x-ray radiation, and electron beam radiation. In the general description above, and below, references to UV imprint lithography and use of UV light are not intended to exclude these and other activating light possibilities.

As an alternative to imprint systems using a planar template that is maintained substantially parallel to the substrate surface, roller imprint systems have been developed. Both hot and UV roller imprint systems have been proposed in which the template is formed on a roller, but otherwise the imprint process is very similar to imprinting using a planar template. Unless the context requires otherwise, references to an imprint template include references to roller templates.

There is a particular development of UV imprint technology known as step and flash imprint lithography (SFIL), which can be used to pattern a substrate in small steps in a similar manner to optical steppers conventionally used in IC manufacture. This involves printing small areas of the substrate at a time by imprinting a template into a UV curable resin, 'flashing' UV light through the template to cure the resin beneath the template, removing the template, stepping to an adjacent region of the substrate and repeating the operation. The small field size of such step and repeat processes minimizes pattern distortions CD variations so that SFIL is particularly suited to manufacture of IC and other devices requiring high overlay accuracy.

Although in principle the UV curable resin can be applied to the entire substrate surface, for example, by spin coating, this is problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid can be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features, while at the same time minimizing excess resin which can be rolled to an undesirably thick or uneven residual layer since as soon as neighboring drops touch fluid the resin will have nowhere to flow. The problems associated with overly thick or uneven residual layer are discussed below.

FIG. 5 illustrates the relative dimensions of the template, imprintable material (e.g., curable monomer, thermosetting resin, thermoplastic, etc) and substrate. The ratio of the width of the substrate, D, to the thickness of the curable resin layer, t, is of the order of about $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned above it is also the source of a number of problems particularly when high resolution and/or overlay accuracy is desired. The first 'breakthrough' etch is anisotropic, but non-selective, and can to some extent erode the features imprinted as well as the residual layer. This is exacerbated if the residual layer is overly thick and/or uneven.

In principle, the above problem can be reduced by ensuring the residual layer is as thin as possible, but this can require application of undesirably large pressures (e.g., increasing substrate deformation) and relatively long imprinting times (e.g., reducing throughput).

The template is a significant component of the imprint lithography system. As noted above, the resolution of the features on the template surface is a limiting factor on the attainable resolution of features printed on the substrate. The templates used for hot and UV lithography are generally formed in a two-stage process. Initially, the desired pattern is written using, for example, electron beam writing, to give a high-resolution pattern in resist. The resist pattern is then transferred into a thin layer of chrome which forms the mask for the final, anisotropic etch step to transfer the pattern into the base material of the template. Other techniques, such as, for example, but not limited to, ion-beam lithography, X-ray lithography, extreme UV lithography, epitaxial growth, thin film deposition, chemical etching, plasma etching, ion etching, or ion milling could be used. Generally, a technique capable of very high resolution will be desired as the template is effectively a 1× mask with the resolution of the transferred pattern being limited by the resolution of the pattern on the template.

The release characteristics of the template can also be an important consideration. The template can, for example, be treated with a surface treatment material to form a thin release layer on the template having a low surface energy (a thin release layer can also be deposited on the substrate).

Although reference is made above to depositing UV curable liquids onto a substrate, the liquids could also be deposited on the template and in general the same techniques and considerations will apply.

Another important consideration in the development of imprint lithography is the mechanical durability of the template. The template is subjected to large forces during stamping of the resist, and in the case of hot lithography, it is also subjected to extremes of pressure and temperature. This will cause wearing of the template, and can adversely affect the shape of the pattern imprinted upon the substrate.

In hot imprint lithography there are potential advantages in using a template of the same or similar material to the substrate to be patterned in order to minimize differential thermal expansion between the two. In UV imprint lithography the template is at least partially transparent to the activation light, and accordingly quartz templates are used.

Although specific reference can be made in this text to the use of imprint lithography in the manufacture of ICs, it should be understood that imprint apparatus and methods described can have other applications, such as the manufacture of integrated optical systems, guidance and detection patterns for magnetic domain memories, hard disc magnetic media, flat panel displays, thin-film magnetic heads, etc.

While in the description above particular reference has been made to the use of imprint lithography to transfer a template pattern to a substrate via an imprintable resin effectively acting as a resist, in some circumstances the imprintable material can itself be a functional material, for example, having a functionally such as conductivity, optical linear or non linear response amongst others. For example, the functional material can form a conductive layer, a semiconductive layer, a dielectric layer or a layer having another desirable mechanical, electrical or optical property. Some organic substances can also be appropriate functional materials. Such applications can be within the scope of an embodiment of the present invention.

Exemplary Imprint Stamp

Figure 6:
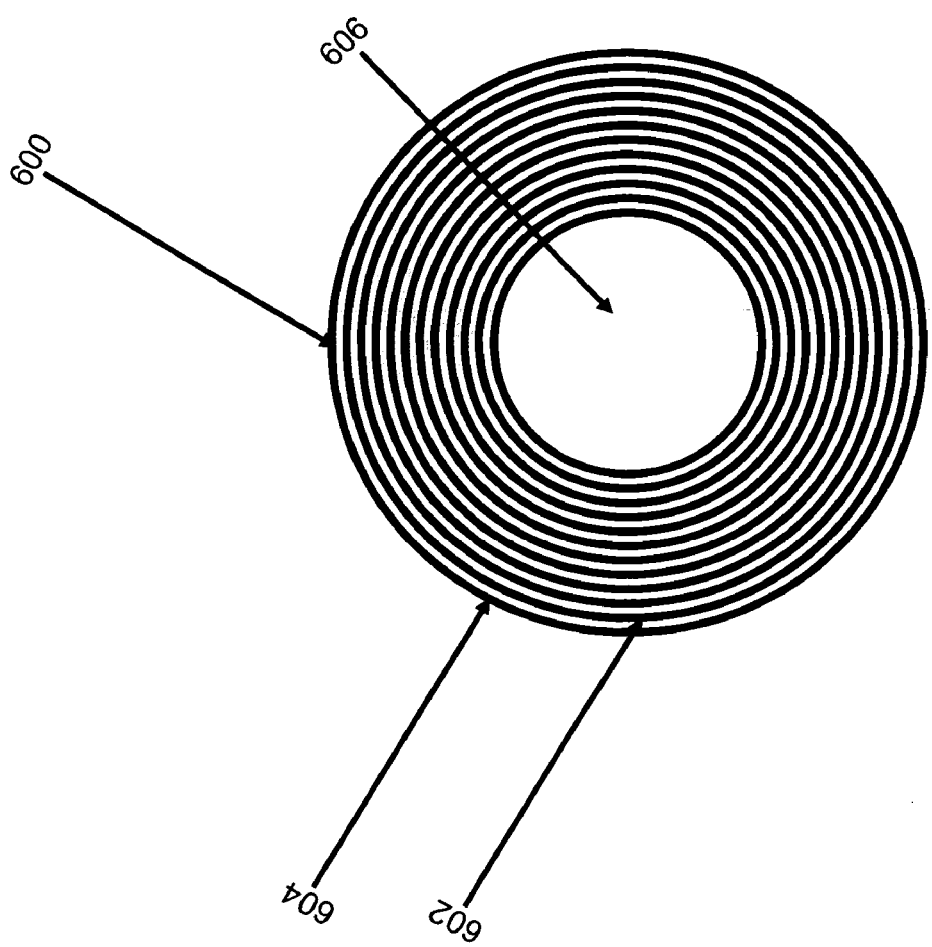
FIG. 6 shows a view of a first pattern on a substrate, according to one embodiment of the present invention.

FIG. 6 shows a view of a first pattern 600 on a substrate (not specifically shown) to begin forming a nanodisk (not shown), according to one embodiment of the present invention. The nanodisk can be a imprint stamp, a memory disk, or the like. For example, FIG. 6 can be a nanodisk that can be formed as described in U.S. application Ser. Nos. 11/012,474 and 11/012,489, both filed Dec. 16, 2004, which are both incorporated by reference herein in their entireties.

First pattern 600 (e.g., a first layer) formed on the substrate comprises a first material 602 (shown as light circles) and a second material 604 (shown as dark circles). Thus, first and second materials 602 and 604 are formed as alternating layers and are formed annularly around a core 606 to form a boule, for example as described in U.S. application Ser. Nos. 11/012,474 and 11/012,489 discussed above. In one example, first material 602 is silicon dioxide and second material 604 is silicon nitride. It is to be appreciated that other materials can also be used. In some examples, first pattern 600 is referred to as a track, master track, defined track, or the like.

Figure 7:
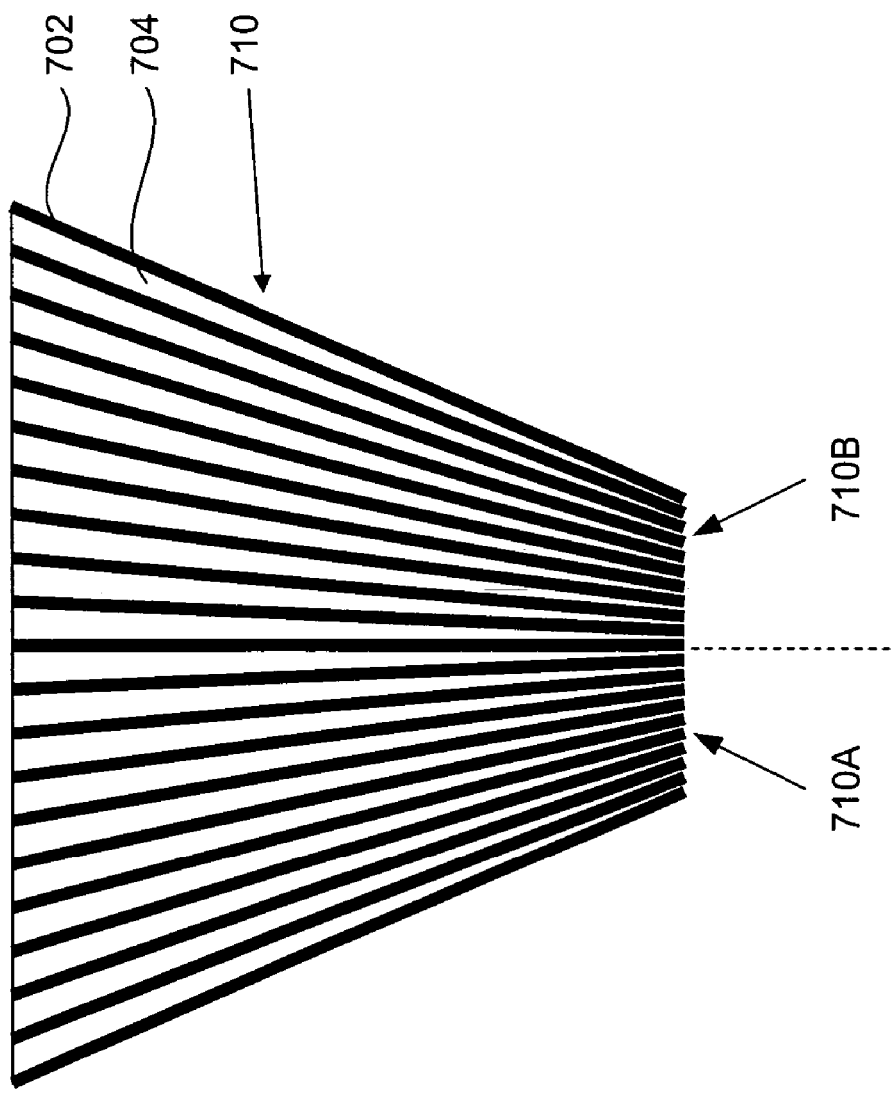
FIG. 7 shows a view of a second pattern on a substrate, according to one embodiment of the present invention.

FIG. 7 shows a view of a second pattern 710 (e.g., second layer) on a substrate, according to one embodiment of the present invention. In the example shown, second pattern 710 is formed as a radial pattern. Second pattern 710 is formed from a first material 702 (shown as light lines) and a second material 704 (shown as dark lines). Thus, first and second materials 702 and 704 are formed as alternating layers. Similar to first pattern 600, in one example first material 702 is silicon dioxide and second material 704 is silicon nitride. For example, second pattern 710 can be formed using the system shown in FIGS. 13A, 13B, and 14, as described in more detail below.

Figure 13A:
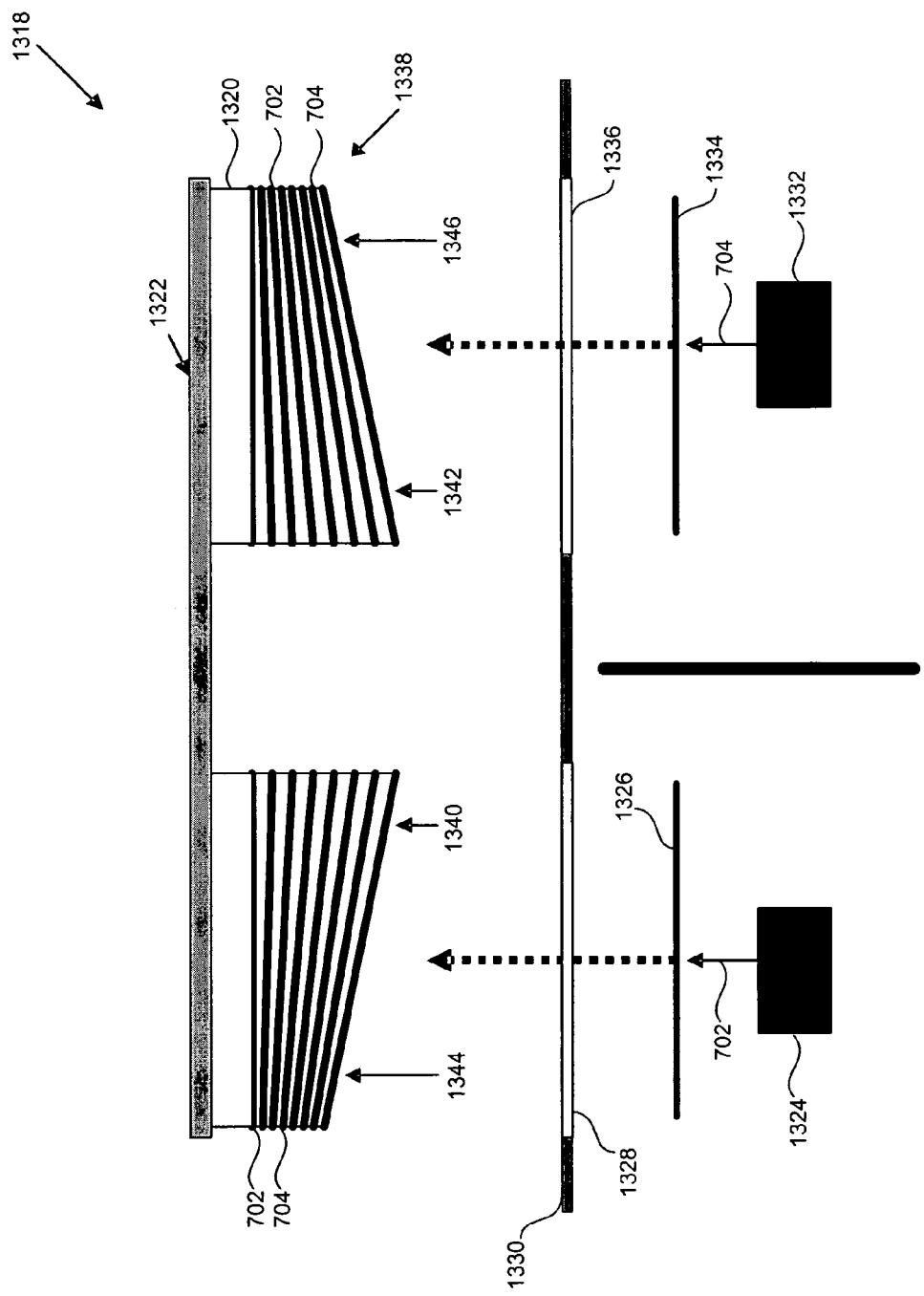
FIG. 13A is a cross-sectional view of a system used to form second pattern shown in FIG. 7, according to one embodiment of the present invention.

In accordance with a first embodiment shown in FIG. 13A, second pattern 710 can be formed from first and second pattern portions 710A and 710B. In accordance with a second embodiment shown in FIG. 14, second pattern 710 can be formed from a single portion 710. Both of these embodiments are described in more detail below (hereinafter, both embodiments are shown and discussed as a single portion 710 for convenience, but not by limitation).

Figure 8:
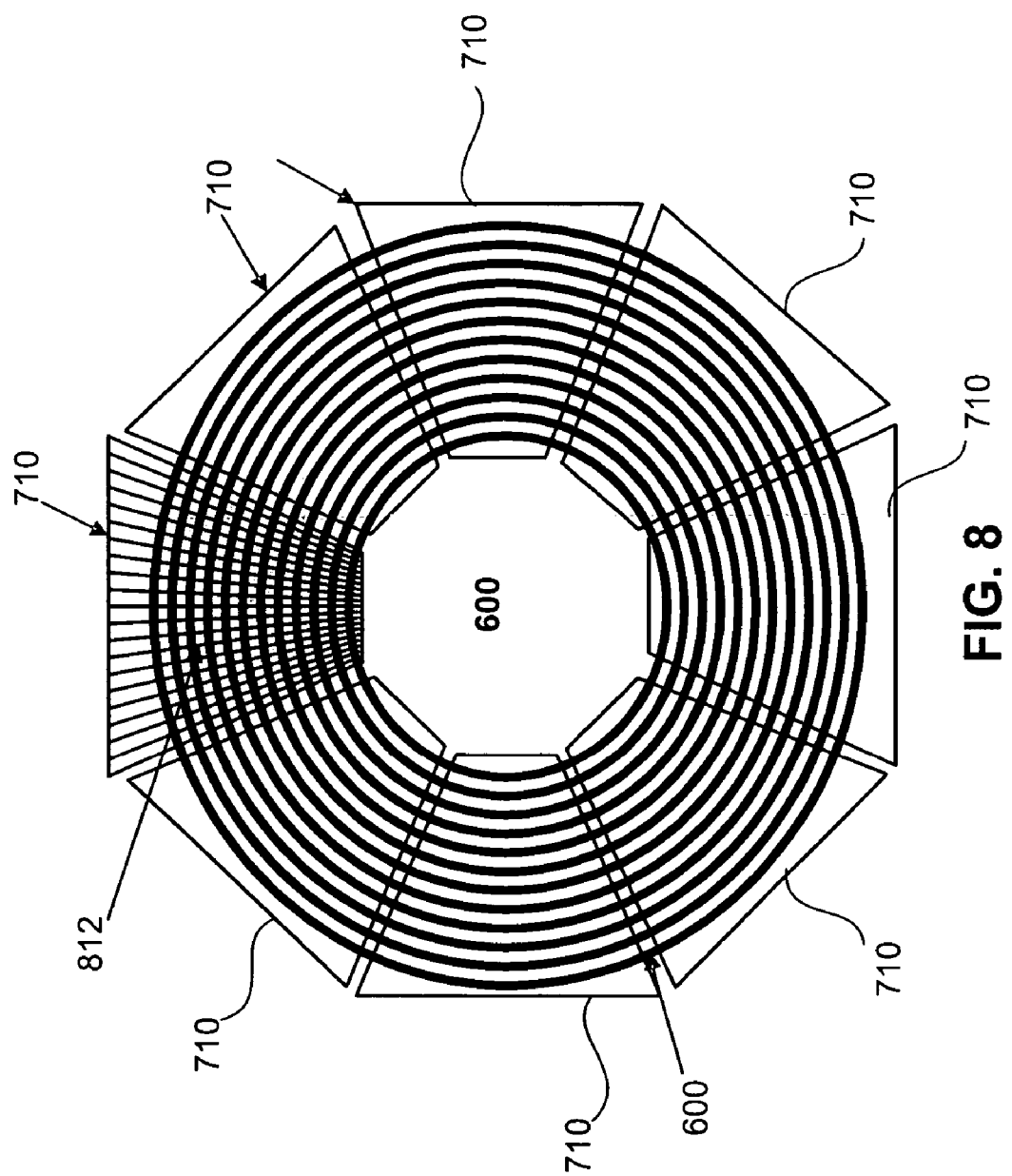
FIGS. 8 and 9 show top and perspective views, respectively, of overlapped first and second patterns in FIGS. 6 and 7, respectively, according to one embodiment of the present invention, for example when imprint is used for pattern transfer.

FIG. 8 show a view of overlapping of the first pattern 600 of FIG. 6 with second pattern 710 in FIG. 7 used to form the nanodisk, according to one embodiment of the present invention. It is to be appreciated that first and second patterns 600 and 710 are not drawn to scale. As can be seen, second pattern 710 is smaller in overall size than first pattern 600, so multiple second patterns 710 are formed on first pattern 600, for example in a radial manner. For clarity, only one of second pattern 710 is fully shown overlapping first pattern 600, while the other ones of second pattern 710 are only shown in outline. When second pattern 710 overlaps first pattern 600, a crosshatch pattern 812 is formed.

In one example, second pattern 710 is formed on first pattern 600 using known pressure, temperature, and timing methods, as would be known to skilled artisans, such that second pattern 710 is coupled to first pattern 600, or the like.

In another example, second pattern 710 is imprinted onto resist coating first pattern 600 quadrant by quadrant using second pattern 710 as a stamp. In one example, this can be done using imprint lithography techniques. In one example, alignment techniques can be used to align each imprinting of second pattern 710 onto first pattern 600 to form cross hatch pattern 812. This imprint method of forming cross-hatch pattern 812 is discussed in more detail below.

Figure 9:
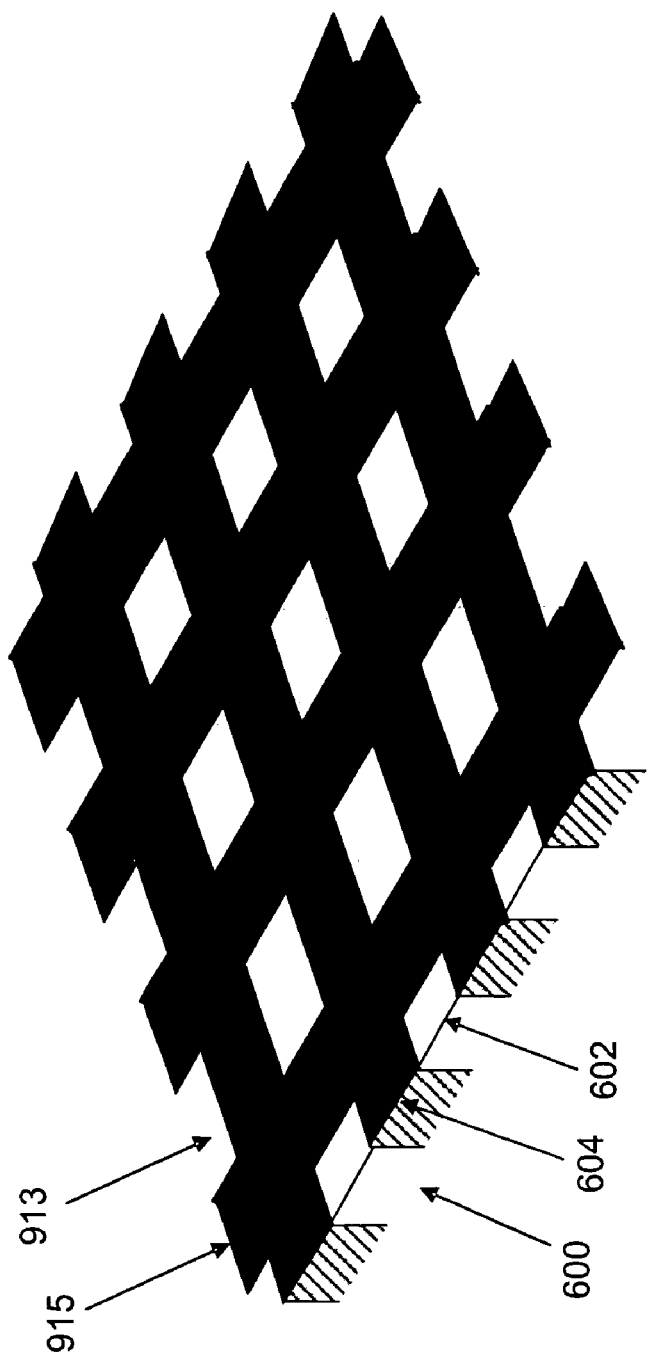

FIG. 9 shows a view of the nanodisk during processing, according to one embodiment of the present invention. This view of the nanodisk is before residual resist in areas 913, which are spaces between resist areas 915, are etched away. Resist areas 915 are formed from imprinting second pattern 710 onto a resist layer formed on first pattern 600.

Figure 10:
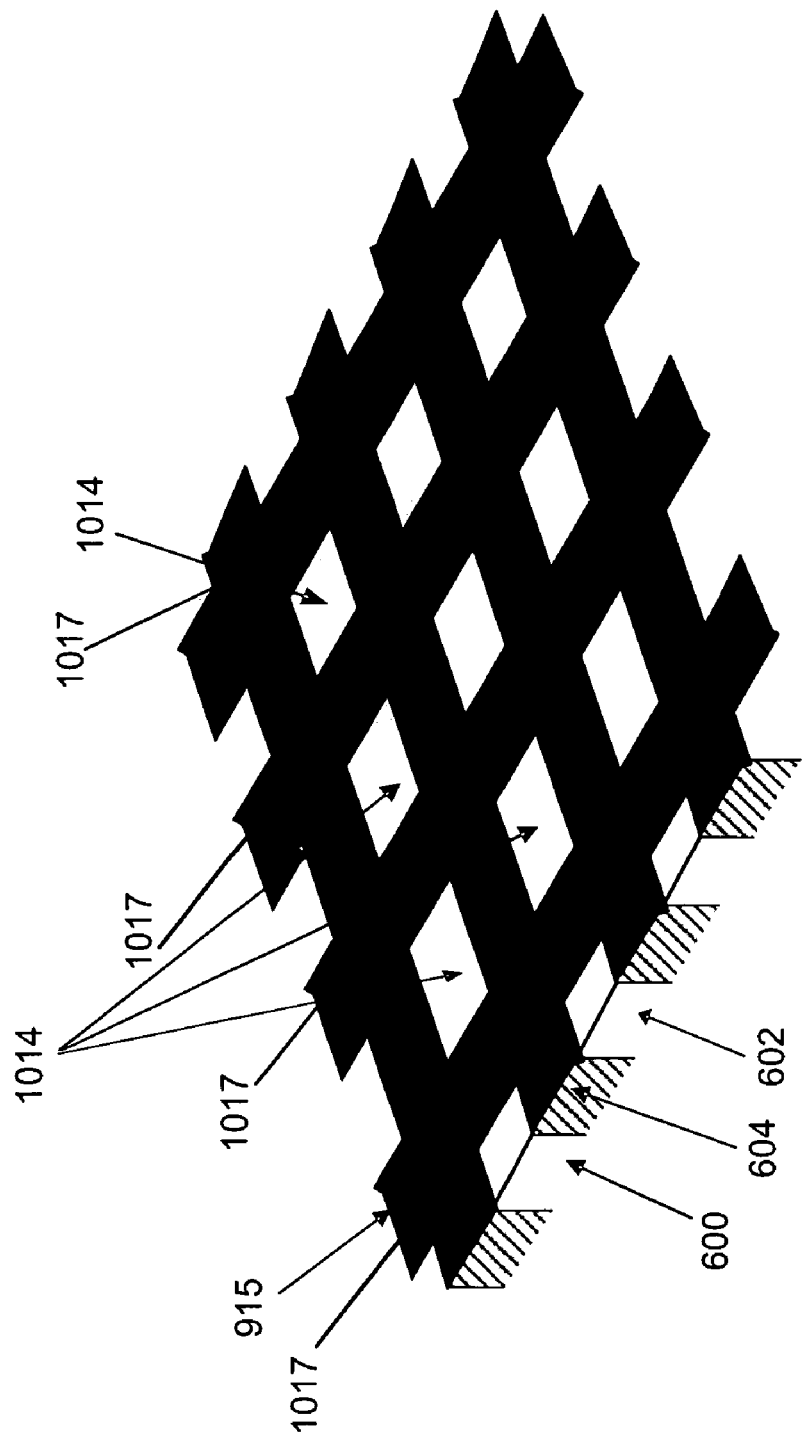
FIGS. 10 and 11 show views of the imprint stamp during and after an etching process, respectively, according to one embodiment of the present invention.
Figure 11:
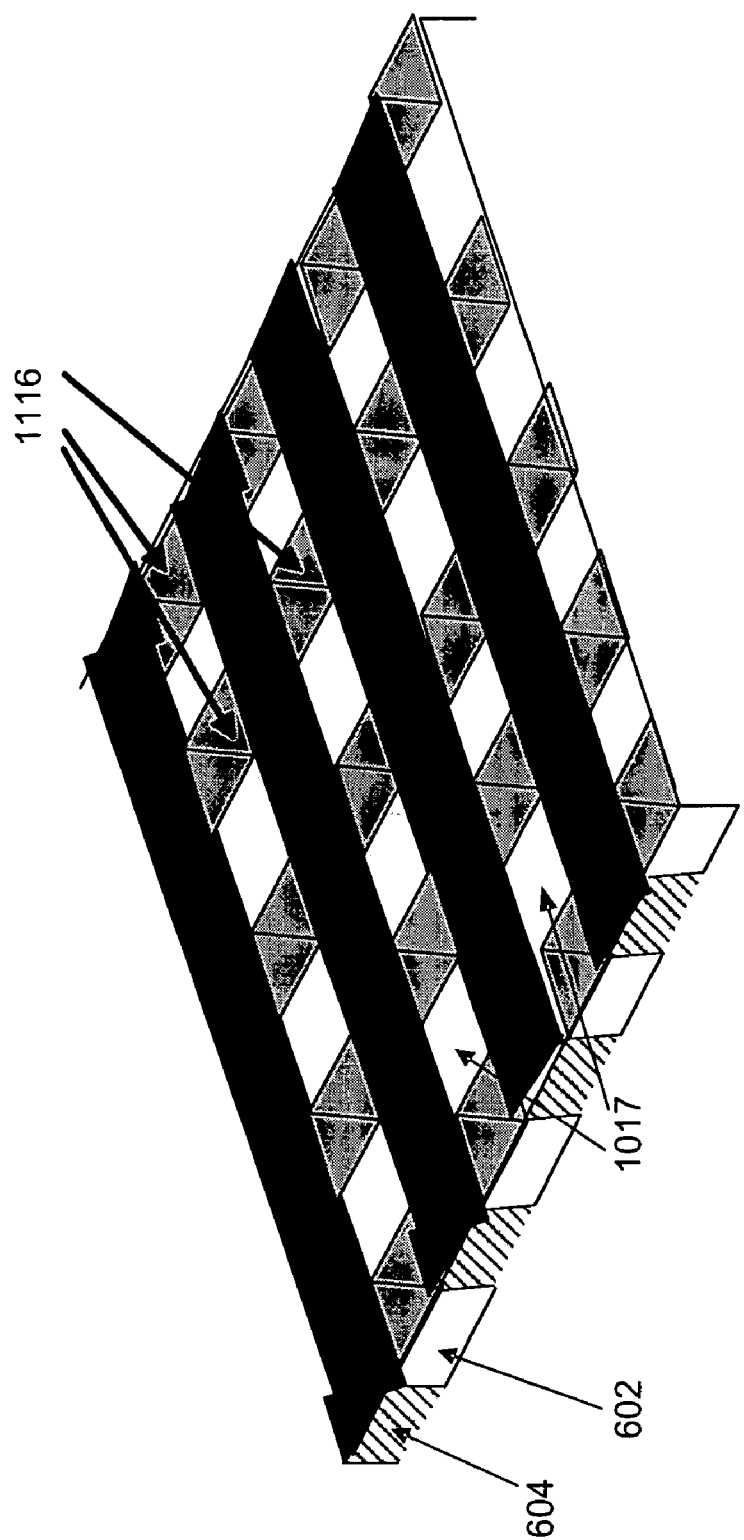

FIGS. 10 and 11 show views of the nanodisk during and after an etching process, respectively, according to one embodiment of the present invention.

With regards to FIG. 10, this view is after residual resist is etched from areas 913, leaving only resist at areas 915. Areas 1014 of first material 602 are exposed between resist areas 915, while areas 1017 of second material 604 are still covered by resist 915.

With regards to FIG. 11, areas 1014 are etched to form holes or pits 1116. This is done by selectively etching at least a portion of first material (e.g., silicon dioxide) 602 of first pattern 600 through selection of an etching material or technique that etches the silicon dioxide and not the silicon nitride. In this embodiment, areas 1116 can be holes, pits, or the like in first pattern 600 of the imprint stamp. For example, the areas 1014 to be etched can be defined where the pattern formed from the first material 702 of the second pattern 710 overlaps the first material 602 of the first pattern 600. Also, areas 1017 are shown, which, as discussed and shown with respect to FIG. 12, form tops of posts 1218.

In one example, when the nanodisk including areas 1116 is used in imprint lithography to imprint a pattern on a surface of a memory disk (not shown) or on a coating of the surface of the memory disk (e.g., a resin or the like), first pattern 600 forms tracks on the memory disk and areas 1116 form posts or extending mesa structures on the surface of the memory disk that extend from the memory disk. These posts or extending mesa structures are later processed so that they comprise magnetic material that is used as a data bit (e.g., coated with a magnetic material). In one example, these posts or extending mesa structures on the memory disk are isolated "island" like structures. This allows for isolated data bit areas that are relatively small and dense to be formed on the memory disk, while allowing the data bits to remain stable, based on their isolation from each other, when influenced by outside thermal and magnetic affects.

Figure 12:
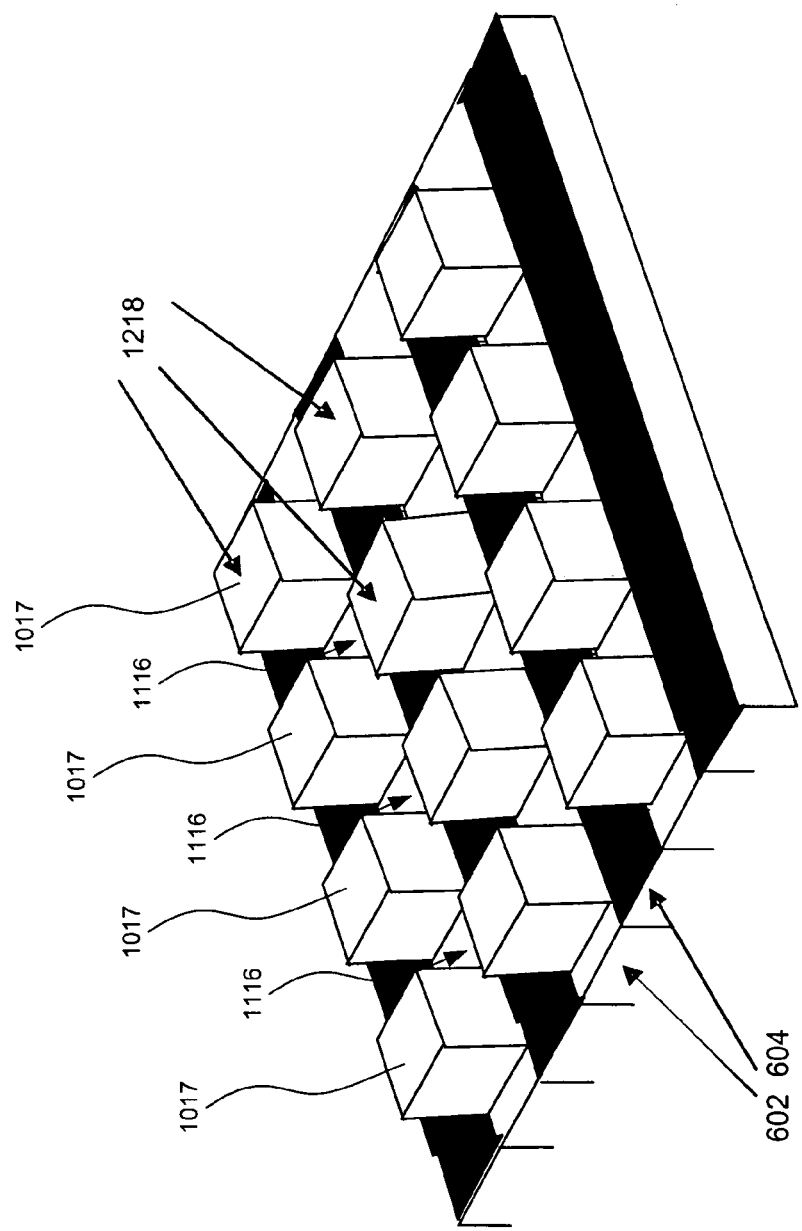
FIG. 12 shows an imprint stamp after an etching process and removal of resist, according to one embodiment of the present invention.

FIG. 12 shows the nanodisk after an additional etching process has been done to the nanodisk shown in FIG. 11, according to one embodiment of the present invention. This additional etching process is only performed if desired for a particular final arrangement of the nanodisk. In this example, an additional etching step subsequent to that shown in FIG. 11 is performed to remove the resist 915 and at least a portion of second material 604 (e.g., silicon nitride) of first pattern 600, which was not initially selectively etched in FIG. 11. This additional etching step can be used to produce a nanodisk that includes posts or mesa structures 1218, which have top surfaces 1017, that extend from the nanodisk adjacent holes or pits 1116.

In one example, when the nanodisk of FIG. 12 is used in imprint lithography to produce memory disks, first pattern 600 is used to produce tracks on the memory disk and posts 1218 can be used with either a UV-cure Resin or Thermal Resist to imprint vias or holes into the memory disk proximate the tracks. These vias or holes are then partially filled with magnetic material to form isolated data bits. Based on their isolation, the data bits formed in the vias or holes will remain stable when influenced by outside thermal and magnetic effects.

Exemplary Systems for Forming an Imprint Stamp

Figure 14:
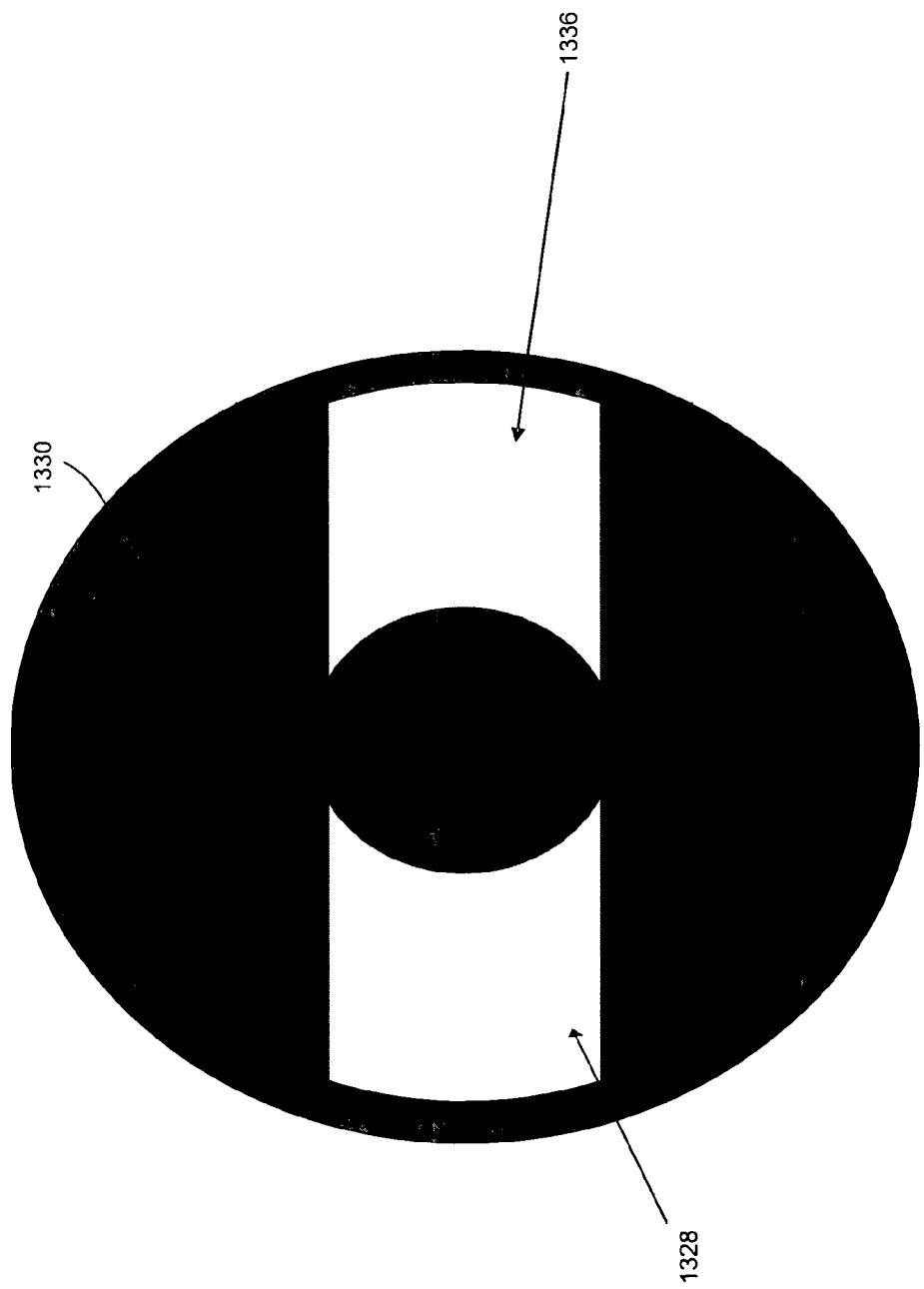
FIG. 14 is a view of a deposition baffle of the system of claim 13A, according to one embodiment of the present invention.

FIG. 13A is a cross-sectional view of a system 1318 that is used to form second pattern 710, according to one embodiment of the present invention. FIG. 14 is a view of a deposition baffle of the system of claim 13A, according to one embodiment of the present invention.

In this embodiment, system 1318 comprises a substrate 1320 releaseably secured to a rotating carousel 1322, or any other device that can rotate substrate 1320. A first source 1324 deposits first material 702 onto substrate 1320 after first material 702 passes through a shutter 1326 and an opening 1328 in a deposition baffle 1330 (see also FIG. 14 for a top view of deposition baffle 1330). Similarly, a second source 1332 deposits second material 704 onto substrate 1320 after second material 704 passes through a shutter 1334 and an opening 1336 in deposition baffle 1330. In one example, first and second source 1324 and 1332, respectively, are thin film deposition sources that operate during alternative time periods utilizing shutters 1326 and 1334.

In one example, a pie-shaped or wedge-shaped nanodisk base structure is produced to produce a pattern, such as pattern 710 shown in FIG. 7. This is accomplished by depositing successive layers of first and second materials 702 and 704 onto substrate 1320 while it is being rotated by rotating carousel 1322 to produce a toroid (e.g., donut) shaped boule 1338. Boule 1338 can then be diamond sawn and have the sawn sections polished. These sawn and polished sections comprise the pie-shaped stamp base structure. The pie-shaped stamp base structure comprises a flat surface with striations of first and second materials 702 and 704 to form first and second portions 710A and 710B of second pattern 710, as shown in FIG. 7.

In one example, the pie shape is produced by having reduced deposition rates of first and second materials 702 and 704 at one end of boule 1338 compared to another end of boule 1338. For example, deposition baffle 1330 can be used to control the deposition rate in conjunction with rotating carrousel 1322. This causes the deposition rate for first and second materials 702 and 704 to be highest closest to the center e.g., at positions 1340 and 1342, of the carrousel 1322 holding the boule 1338 and to be slowest at the edges, e.g., at positions 1344 and 1346, of the carousel 1322 holding the boule 1338.

Figure 13B:
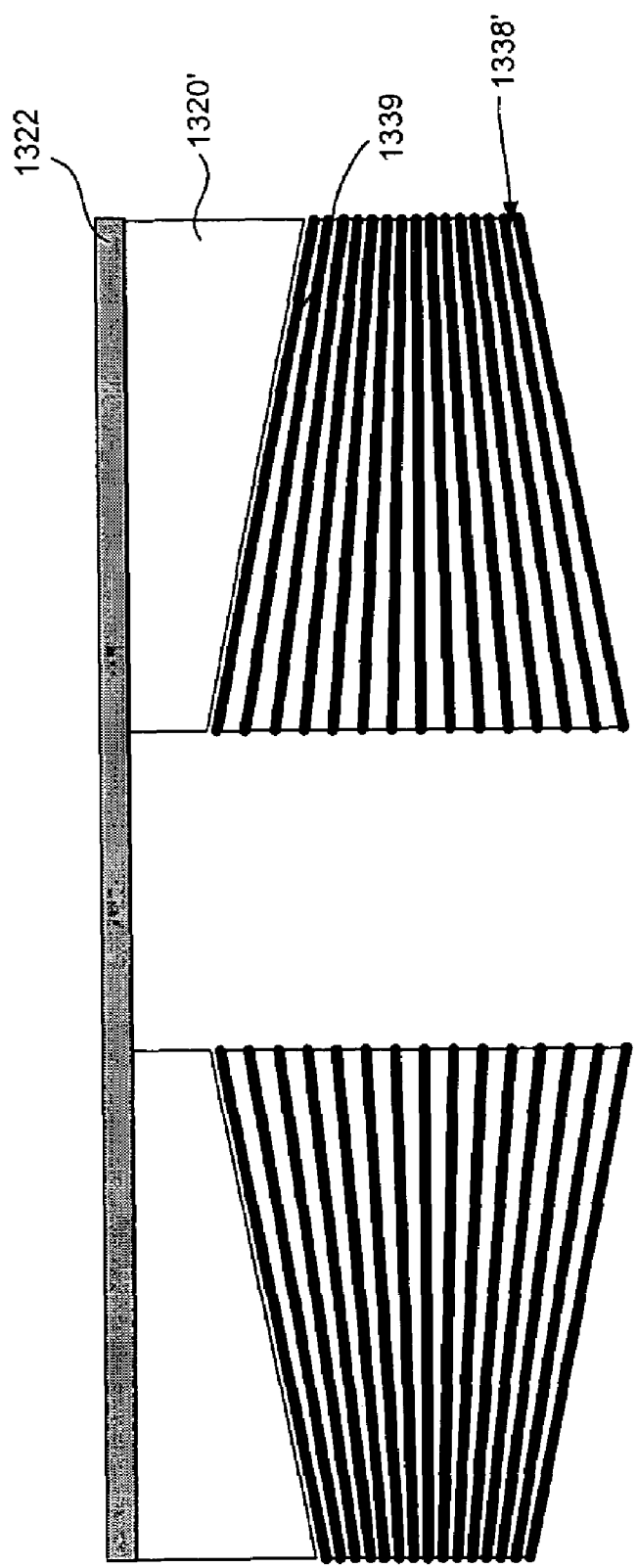
FIG. 13B shows a portion of the system in FIG. 13A, according to another embodiment of the present invention.

FIG. 13B shows a portion of the system in FIG. 13A, according to another embodiment of the present invention. In this embodiment, substrate 1320' has a sloped material receiving surface 1339. When first and second materials 702 and 704 are deposited on substrate 1320', as discussed above, a boule 1338' is formed that, when cut and polished, form pattern 710 from a single portion, and not a double portion as discussed above with regards to FIG. 13A.

In one example, the above-described method of fabricating the nanodisk allows for almost unlimited resolution of a pattern formed on a memory disk by the nanodisk. For example, line/space resolution of 9 nm have been achieved for basic tracks formed by a similarly produced nanodisks when used in imprint lithography to pattern a memory disk. In one example, discrete islands of 9 nm by 9 nm are thought to be possible, while other resolutions significantly below this may also be possible.

Exemplary Servo Tracking Patterns and System to Form Same

A memory disk generated with the above nanodisk formed using the systems and methods described, for example, in FIGS. 6-14, typically can comprise both data bit tracks, which include the data bits described above, and can also include servo tracking patterns used to guide tracking of a head or heads (e.g., read/write head(s)) over the data bit tracks. These servo tracking patterns usually consist of a set of bits offset from set of data bits associated with the track. The servo tracking pattern of the offset bits is predetermined and is shaped so that as the head (or heads) pass over the offset bits, the position of a servo head with respect to a center of a track including the data bits can be monitored.

Figure 15:
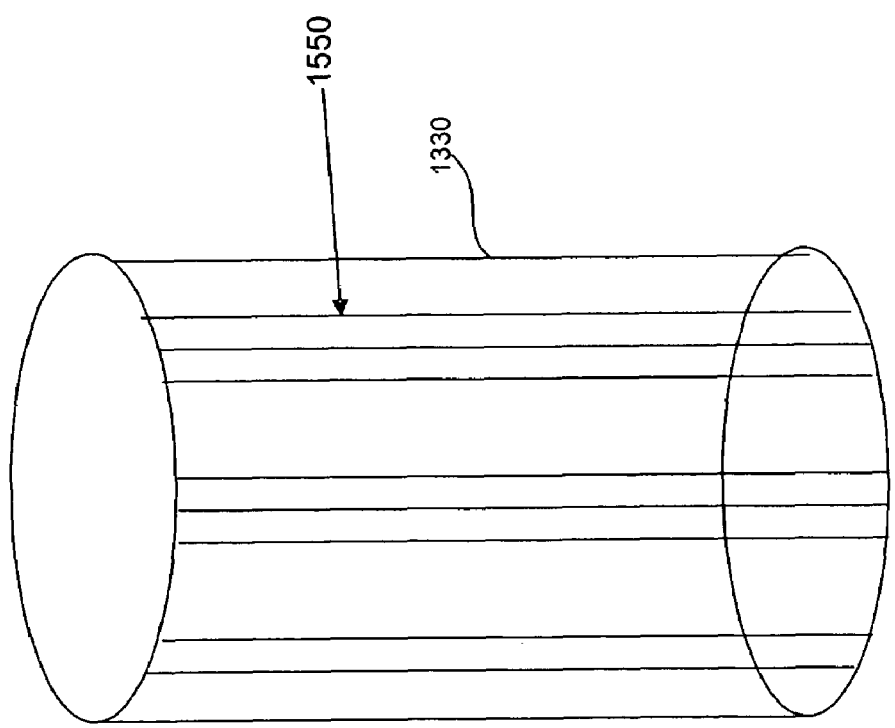
FIG. 15 shows a core for producing an imprint stamp having servo tracking patterns, according to one embodiment of the present invention.
Figure 16:
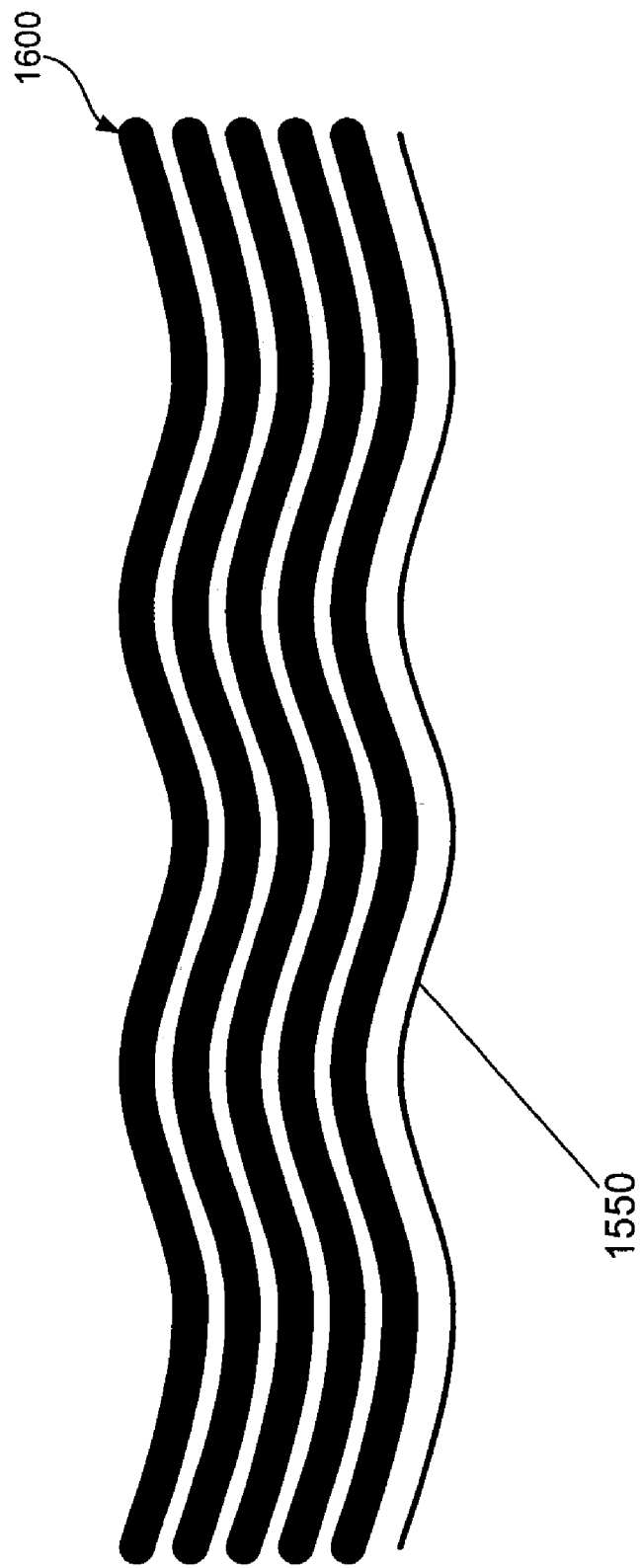
FIG. 16 are views of patterns on an imprint stamp to produce servo tracking patterns, according to one embodiment of the present invention.

FIG. 15 shows a core 1506 having grooves 1550, according to one embodiment of the present invention. FIG. 16 are views of patterns on an nanodisk or imprint stamp to produce servo tracking patterns, according to one embodiment of the present invention. For example, core 1506 can be used to receive first and second materials 602 and 604 and then sliced to form an alternative first pattern 1600 of an imprint stamp or nanodisk. Pattern 1600 is altered compared to first pattern 600 shown in FIG. 6 because grooves 1550 forms a "wobble" in the pattern, as discussed below. As discussed above, the servo tracking pattern 1600 on an imprint stamp or nanodisk can be used in imprint lithography to form servo tracks and data bit tracks, respectively, on a memory disk, for example.

As shown in FIG. 15, a cluster of grooves 1550 are formed in a surface of a core 1506 (e.g., a quartz rod). Groves 1550 are formed at regular intervals around a circumference of core 1506 in such a way as to put a displacement into a radius of pattern 1600 that forms tracks on a memory disk. As the pattern 1600 is built up with successive layers, the displacement in what will become a track position on the memory disk is translated through all layers. For example, this displacement can be a pre-programmed "wobble" that can be changed into an AC signal that can be read and interpreted by a head to indicate whether a head is moving off right or off left of a desired data bit track position.

Figure 17:
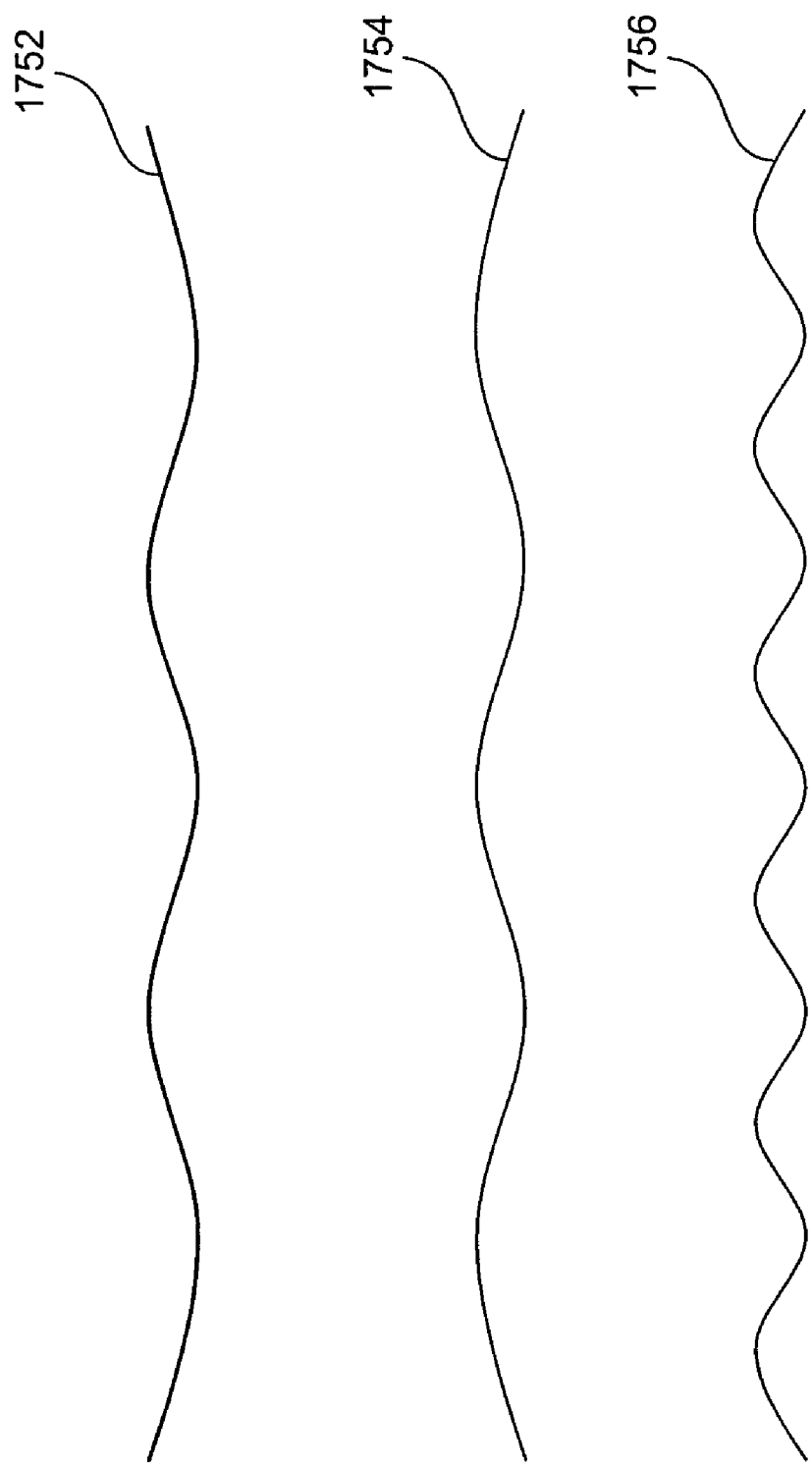
FIG. 17 are waveforms generated by a head reading servo tracking patterns, according to one embodiment of the present invention.

FIG. 17 shows waveforms 1752-1756 generated by a head reading servo tracking patterns formed on a memory disk using pattern 1600, according to one embodiment of the present invention. In one example, when a head passes over a pattern cluster including servo tracking patterns on the memory disk formed by pattern 1600, the head will generate an amplitude modulation at a frequency related to rotation speed of the memory disk and the spacing of the data bits tracks formed on the memory disk using pattern 1600 on the imprint stamp during imprint lithography. This servo tracking signal can be monitored to adjust a position of the head during reading of the data bits.

In one example, the head is centered when a signal is maximized and when a signal frequency is doubled, as shown in waveform 1756. A phase of the signal generated by the head from reading the offset bits in the servo tracking pattern on the memory disk indicates whether the head is to the inside or to the outside of the data bit track radius. For example, waveform 1752 is detected when the head is to the right of the track 1550 and waveform 1754 is detected when the head is to the left of the track 1550.

In one example, a servo actuator system would receive the signals from the head and actuate movement of the head based on the signals, as would be known to a skilled artisan. For example, the servo actuator system can be a learning system that saves data of historical misalignments for future adjustment.

In one example, hard drive platens (e.g., memory disks) could have a data bit track broken up into zones and into sectors. The hard drive platen zones are tracks with varying radii. For example, an inner zone, a mid zone, and an outer zone can have a gap between the zones in terms of track positions. Then, each of the zones are divided up into sectors, like pie-shaped pieces, and the beginning and end of each sector has various read-write control data bits, which allow, for example, the amplitude of the signal to be automatically adjusted, position of the head to be adjusted. The zones may also have markers that indicate a beginning or an end of where the data is programmed in the platen. Thus, in this example, the hard drive platens are not necessarily a continuous a continuous array of data bits, rather they comprise a format structure.

It is to be appreciated that in addition to an imprint lithography system being used to form tracks and servo tracks on a memory disk, as is discussed above, an interference imager using two coherent light beams that are converged together in a fluid using immersion to form an interference grating type image on a substrate may be used to print tracks on a memory disk.

Exemplary Method

Figure 18:
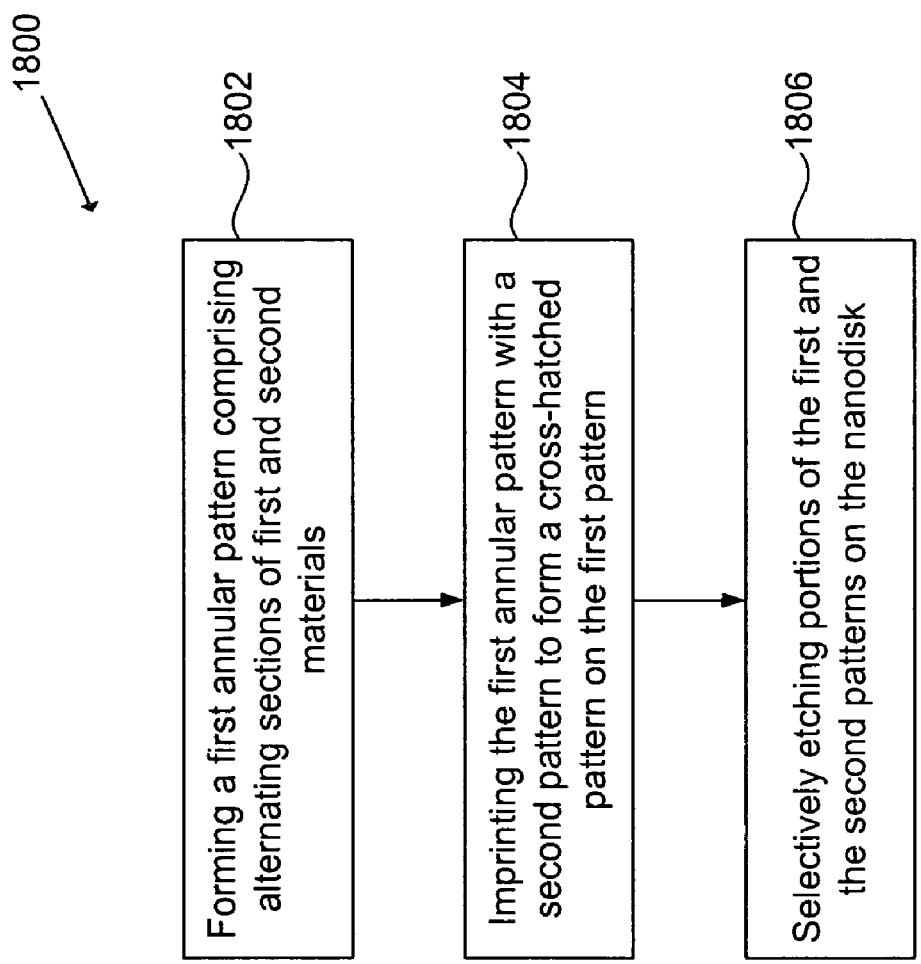
FIGS. 18 and 19 show flowcharts depicting various methods, according to various embodiments of the present invention.

FIG. 18 shows a flowchart depicting a method 1800 for forming a nanodisk having areas used to pattern data bit areas on a memory disk using imprint lithography, according to one embodiment of the present invention. In step 1802, a first annular pattern is formed that comprises alternating sections of first and second materials. In step 1804, the first annular pattern is imprinted with a second pattern to form a cross hatched pattern on the first pattern. In step 1806, portions of the first and the second patterns on the nanodisk are selectively etched.

Figure 19:
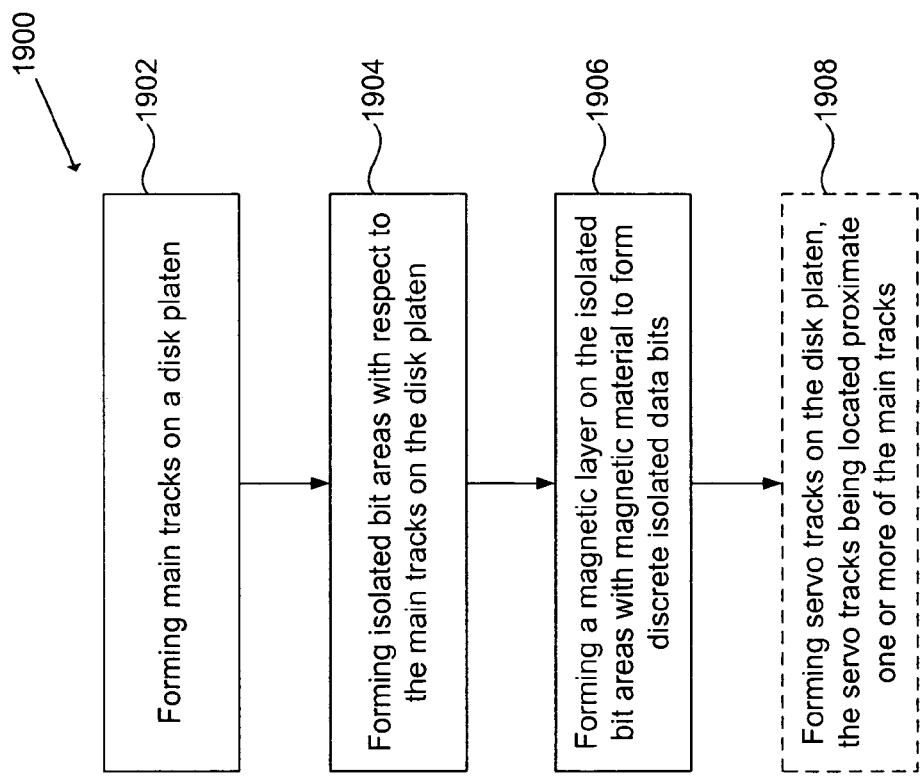

FIG. 19 shows a flowchart depicting a method 1900, according to one embodiment of the present invention. For example method 1900 can be a method of manufacturing a memory disk. In step 1902, main tracks are formed on a disk platen. In step 1904, isolated bit areas are formed with respect to the main tracks on the disk platen. In step 1906, a magnetic layer is formed on the isolated bit areas with magnetic material to form discrete isolated data bits.

In one example, in step 1904 pits are formed in the disk platen and in step 1906 the magnetic material is deposited in the pits to form the discrete isolated data bits.

In another example, in step 1904 posts are formed on the disk platen and in step 1906 the posts are coated with the magnetic material to form the discrete isolated data bits.

In one example, in step 1908 servo tracks are formed on the disk platen, the servo tracks being located proximate one or more of the main tracks.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method of forming a nanodisk, comprising:

(a) forming a first annular pattern comprising alternating sections of first and second materials;

(b) imprinting the first annular pattern with a second pattern to form a cross hatched pattern on the first pattern; and (c) selectively etching portions of the first and the second patterns on the nanodisk.

2. The method according to claim 1, wherein the second pattern comprises a wedge-shaped pattern comprising alternating sections of the first and second material.

3. The method of claim 2, further comprising:
using silicon dioxide as the first material; and
using silicon nitride as the second material.

4. The method according to claim 1, further comprising:
(d) patterning a memory disk with the nanodisk to pattern data bit areas on a memory disk.

5. The method of claim 4, wherein step (d) results in forming the areas on the imprint stamp that are used to form at least one of holes, vias, and pits as the data bit areas on the memory disk.

6. The method of claim 4, wherein step (d) results in forming the areas on the imprint stamp that are used to form at least one of posts and raised portions as the data bit areas on the memory disk.

7. The method according to claim 1, wherein the nanodisk comprises a imprint lithography stamp.

8. The method of claim 1, wherein step (b) is performed using a second pattern that is formed at a plurality of unoverlapping positions radially around the first pattern.

9. The method of claim 1, wherein step (a) comprises:
using silicon dioxide as the first material; and
using silicon nitride as the second material.

10. The method of claim 1, further comprising:
(d) forming a servo tracking pattern in the first pattern that is used to pattern servo tracks on a memory disk.

* * * * *